United States Patent [19]

Rynk et al.

[11] Patent Number: 4,637,136

[45] Date of Patent: Jan. 20, 1987

[54] METHOD AND APPARATUS FOR WIRING SYSTEM INSTALLATION

[75] Inventors: Anthony J. Rynk, East Brunswick; David J. DeCarlo, Toms River, both of N.J.

[73] Assignee: Thomas & Betts Corporation, Raritan, N.J.

[21] Appl. No.: 646,595

[22] Filed: Aug. 31, 1984

[51] Int. Cl.[4] ........................ H01R 43/00; G01B 3/30; B23Q 3/00; H05K 1/00

[52] U.S. Cl. .................................... 29/872; 33/180 R; 29/464; 339/17 F; 339/97 C

[58] Field of Search ....................... 29/566.4, 868, 872, 29/464; 33/180 R; 339/17 E, 17 F, 97 R, 97 C

[56] References Cited

U.S. PATENT DOCUMENTS

| | | | |
|---|---|---|---|
| Re. 31,336 | 8/1983 | Weinmann et al. | 29/868 |
| 2,613,287 | 10/1952 | Geiger | 339/17 E |
| 4,258,974 | 3/1981 | Kuo et al. | 339/17 F X |
| 4,259,778 | 4/1981 | Greenwood | 29/566.4 X |
| 4,315,662 | 2/1982 | Greenwood et al. | 339/97 |

*Primary Examiner*—Howard N. Goldberg
*Assistant Examiner*—Carl J. Arbes
*Attorney, Agent, or Firm*—Robert M. Rodrick; Salvatore J. Abbruzzese

[57] ABSTRACT

A connection zone location and selection device is provided for application to first and second flat multiconductor cables secured to one another in overlapped relation. In such arrangement, the secured cables define a matrix of connection zones each having in registry therewith a distinct pair of conductors of the cables. The device is adapted for movement with respect to the cables and includes a punch for making perforations through the cables and locator indices for registration with a preselected location on the cables or with perforations made by the punch for disposing the punch in registry with selected ones of the connection zones. Methods and a kit of components for making undercarpet power installations are also provided.

24 Claims, 11 Drawing Figures

METHOD AND APPARATUS FOR WIRING SYSTEM INSTALLATION

FIELD OF THE INVENTION

This invention relates generally to the installation of undercarpet wiring systems and pertains perticularly to method and apparatus for identifying and selecting locations for connection of conductors of flat multiconductor cables in effecting such installations.

BACKGROUND OF THE INVENTION

In present commercial undercarpet wiring systems, a main five conductor flat cable generally extends upon a floor from a discrete wired three-phase feeder into the area to be served with power. Taps are made to the main cable by connecting thereto three or four conductor flat secondary cables. A three conductor cable can tap any one of the three phases of the five conductor cable. The four conductor cables tap off two phase power and each phase thereof may in turn be tapped off by connection of further three conductor secondary cables to the four conductor cable.

In the commercial wiring system introduced by the assignee hereof, the secondary cables are placed in overlapping relation to the main cable. Connections are made between conductors of the cables being interconnected by making a perforation through such conductors, inserting an insulation-piercing connector therein and crimping same onto each of the cables to pierce the insulation thereof and electrically engage the respective conductors.

As is set forth in detail in U.S. Pat. No. Re. 31,336 and U.S. Pat. No. 4,315,662, both commonly assigned herewith, such overlapping system is effectively installed by providing assistance to the installer as respects the selection of connections to be made. Referring to FIG. 4 of U.S. Pat. No. Re. 31,336, when one applies a four conductor cable atop a five conductor cable, twenty zones of registration exist as between the nine individual conductors at hand. Improper zone selection possibilities abound, absent guidance to an installer.

Such guidance is presented by method in U.S. Pat. No. Re. 31,336 whereby, upon selection of an origin zone for connection, the method precludes from connection use all other connection zones in registry with the neutral conductors present at the origin zone. This practice is repeated for the ground conductors of the cables, which separate the neutral conductors from the active phase conductors. Following this step, the method provides for selection plural zones in registry with individual conductors among remaining conductors, while precluding from connection use other zones in registry with such conductors, as will be understood further by reference to the U.S. Pat. No. Re. 31,336. The method leads to a connection pattern wherein connection zones in limited number are made accessible and indication is provided for selective use of such accessible zones. A template for use in practicing this method is shown in both the U.S. Pat. No. Re. 31,336 and U.S. Pat. No. 4,315,662, both of which are incorporated herein by this reference thereto.

While fully effective for implementing the described method, the template referred to has certain practical shortcomings. Since the template is used also for aligning the cables in mutually orthogonal relation in the case of a tap, and in aligned relation in the case of a splice, the template is present in the course of installation, cable run by cable run, and includes a plate assembly for disposition beneath the cables for receiving and aligning same. This gives rise to both expense and bulkiness of the template tool and increased installation time. Further, since the template implements the step of precluding access to unused connection zones in its preferred embodiment by blocking access thereto through the intervening presence of physical matter over such zones, it is relatively heavy and not readily handled.

SUMMARY OF THE INVENTION

The present invention has as its object the provision of improved practices and apparatus for the installation of the overlap type of undercarpet wiring system.

More particularly, the invention looks to provide improved connection zone selection devices for such installations.

In another aspect, the invention seeks an improved kit of components for installation of the overlap type of system.

In attaining the foregoing and other objects, the invention provides a connection selection device which has a self-contained punch for cable penetration and is adapted for direct application to overlapped cables in place upon a floor and for selective movement relative thereto for disposing the punch in the connection pattern positions of the template of the patients above discussed. The connection selection device has the full connection zone pattern capability of such prior template and the further capability of disposing its punch successively in subgroups of such pattern connection zones through locator indices thereof.

The foregoing and other objects and features of the invention will be further evident from the following detailed description of preferred embodiments and practices thereof and from the drawings wherein like reference numerals identify like parts throughout.

DESCRIPTION OF PREFERRED EMBODIMENTS AND PRACTICES

Figure 1:
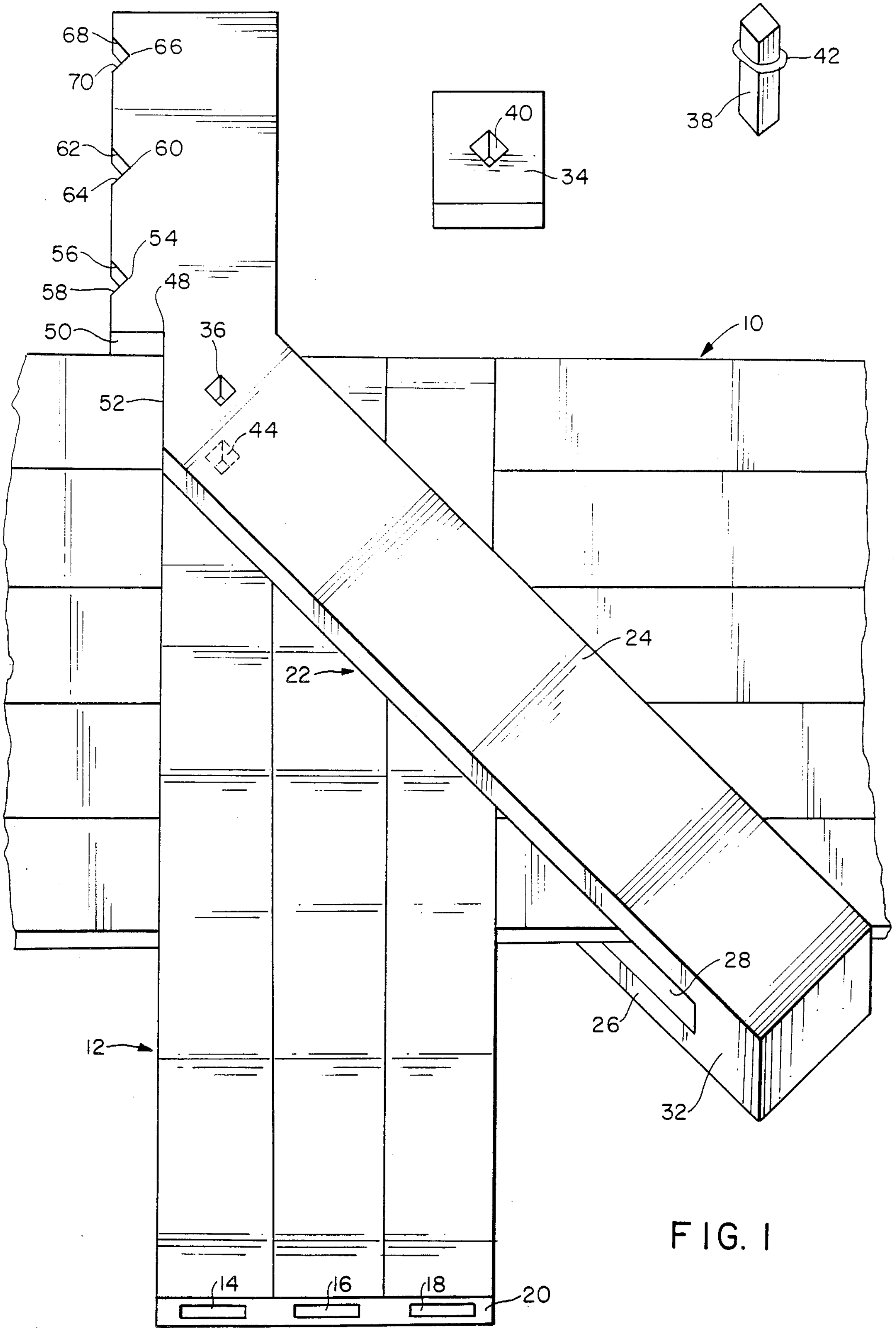
FIG. 1 is a perspective view of connection location and selection apparatus of the invention applied to a pair of multiconductor flat cables in tap configuration, the punch and punch seat being shown in exploded fashion.

Referring to FIG. 1, flat cables 10 and 12 respectively have five and three conductors of generally rectangular cross-section, as indicated at 14, 16 and 18 for cable 12, and disposed within electrically insulative casing material, shown at 20 for cable 12.

Cables 10 and 12 are secured to one another in illustrated mutually orthogonal arrangement, desirably by the use of double-sided adhesive tape (not shown) disposed between the cables in the interior area of their registry.

Figure 2:
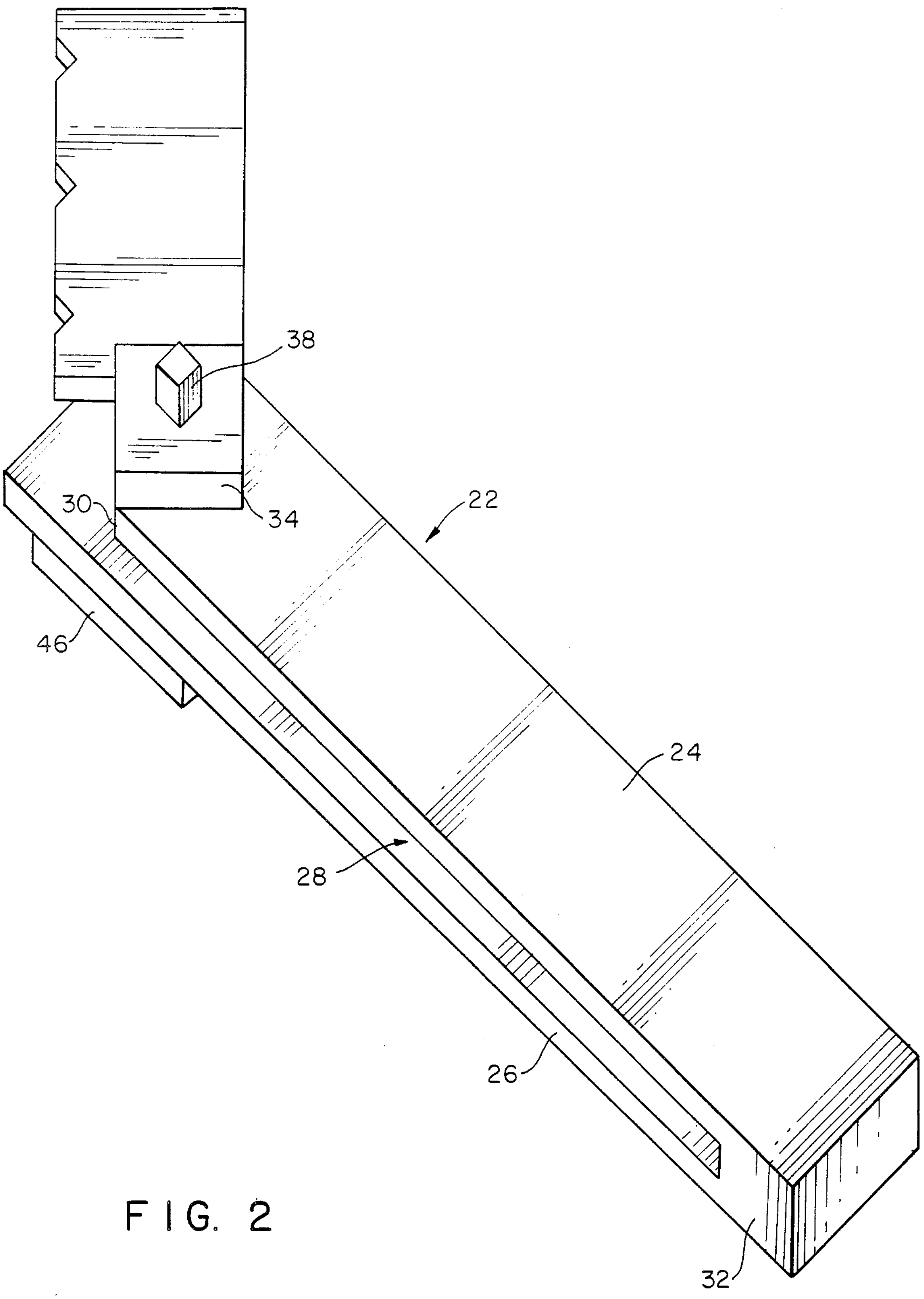
FIG. 2 is a separate perspective view of the FIG. 1 apparatus.

Connection locating and selecting apparatus or tool 22 is applied to the secured cables 10 and 12, and includes an upper substrate 24 and a lower substrate 26, defining therebetween a slot 28 open at end 30 (FIG. 2) to permit application of the tool to the cables. Tool 22 also has part 32 joining substrates 24 and 26 and both supporting same in mutually parallel relation and closing the end of slot 28 opposite open end 30.

Substrate 24 has punch housing or seat 34 secured thereon (FIG. 2) in registry with substrate 24 punch channel 36. Punch 38 is seated in punch channel 40 and is biased into inoperative position by spring 42. Lower substrate 26 has punch penetration channel 44 and punched metal bin 46, which is suitably releasably secured to substrate 26 to facilitate removal of punched cable matter therefrom.

Tool 22 has several locational indices thereon for effecting placement of punch 38 in various selected positions relative to the cables, as discussed below. One such index is defined by notch 48, which has mutually orthogonal edges 50 and 52 and thus has configuration in common with punch 38 and perforations made thereby. A second such index is defined by notch 54, which has mutually orthogonal edges 56 and 58, again configured in common with punch perforations. A third such like-configured index is defined by notch 60, which has mutually orthogonal edges 62 and 64. A fourth such like-configured index is defined by notch 66, which has mutually orthogonal edges 68 and 70. Indices 48, 54, 60 and 66 constitute primary locator indices. Secondary locator indices are shown by lines 72, 74, 76, 78 and 80. The use of the primary and secondary locator indices and the literal data shown at L1 through L9 on substrate 24 (FIG. 3) is discussed below.

Figure 3:
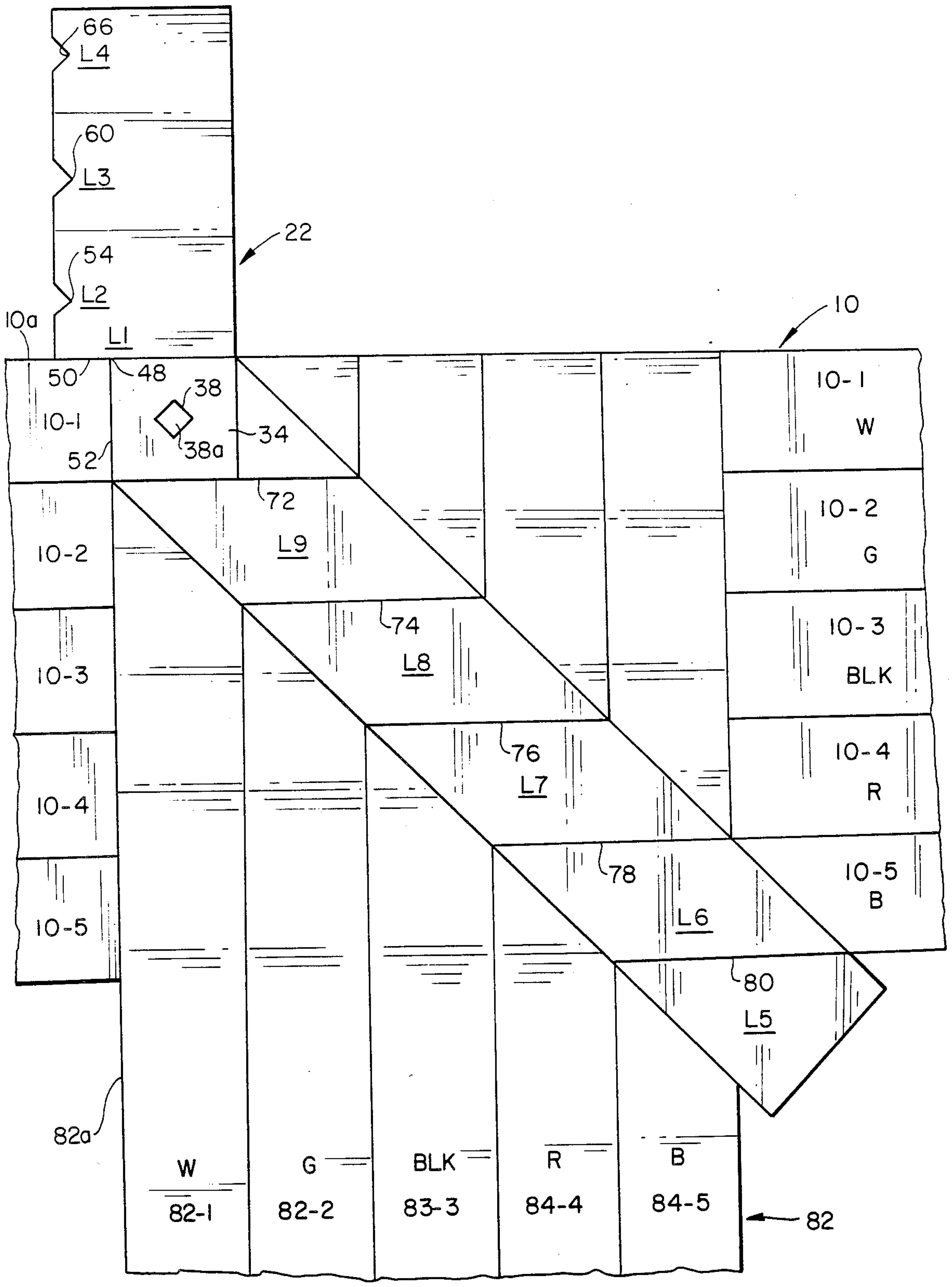
FIG. 3 is a top plan view of the FIG. 1 apparatus in first position relative to overlapped five conductor cables.

Practice in accordance with the invention will be discussed now in an initial manner in connection with FIGS. 3–5. In FIG. 3, five conductor cable 10 is secured to five conductor cable 82, individual cable conductors being noted at 10-1 through 10-5 and 82-1 through 82-5. A matrix of twenty five connection zones is defined on securement of cables 10 and 82, each zone having a unique pair of cable conductors in registry therewith. An origin zone thus has conductors 10-1 and 82-1 in registry.

First locator index notch 48 is placed such that its edges 50 and 52 are aligned with the cable insulative casing margins 10*a* and 82*a*. Line indicium 80 is applicable and is aligned with the bottom margin of cable 10. This places punch 38 centrally in the origin zone 10-1/82-1. Punch 38 is now operated, such as by a hammer blow to its free end 38*a*, thereby providing first or origin perforation 84 (FIG. 4), extending through both conductors 10-1 and 82-1.

Second locator index notch 54 is now placed (FIG. 4) such that its edges 56 and 58 are aligned with origin perforation 84 and line indicium 78 is aligned with the bottom margin of cable 10. This places punch 38 centrally in the connection zone having conductors 10-2 and 82-2 in registry. Punch 38 is again operated to provide second perforation 86 (FIG. 5), which extends through both conductors 10-2 and 82-2.

In the case of a five-five conductor tap, under present discussion, zones for use all lie along the diagonal of the overlap of cables 10 and 82, in contrast to phase balancing practice discussed below. In the five-five case, the third cable perforation is made by placing second locator notch 54 such that its edges 56 and 58 are aligned with the previously made perforation, i.e., second perforation 86 and line indicium 76 is aligned with the bottom margin of cable 10. This places punch 38 centrally in the connection zone having conductors 10-3 and 82-3 registry (FIG. 5). Likewise, the fourth and fifth perforations (not shown) are obtained by placement of notch 54 in registry with the respective previously made perforation and applicable line indicia 74 and 76 are aligned indivdiually with the bottom of cable 10. Upon operation of punch 38 in each instance, the fourth and fifth perforations will exist centrally in the connection zones respectively having in registry therewith conductors 10-4 and 82-4 and 10-5 and 82-5.

At this juncture, the installer would have at hand secured first and second five conductor cables with perforations through the five connecting zones along the diagonal of the overlap, readied for the receipt and crimping of insulation-piercing connectors for interconnection of conductors in registry at such zones.

Figure 5:
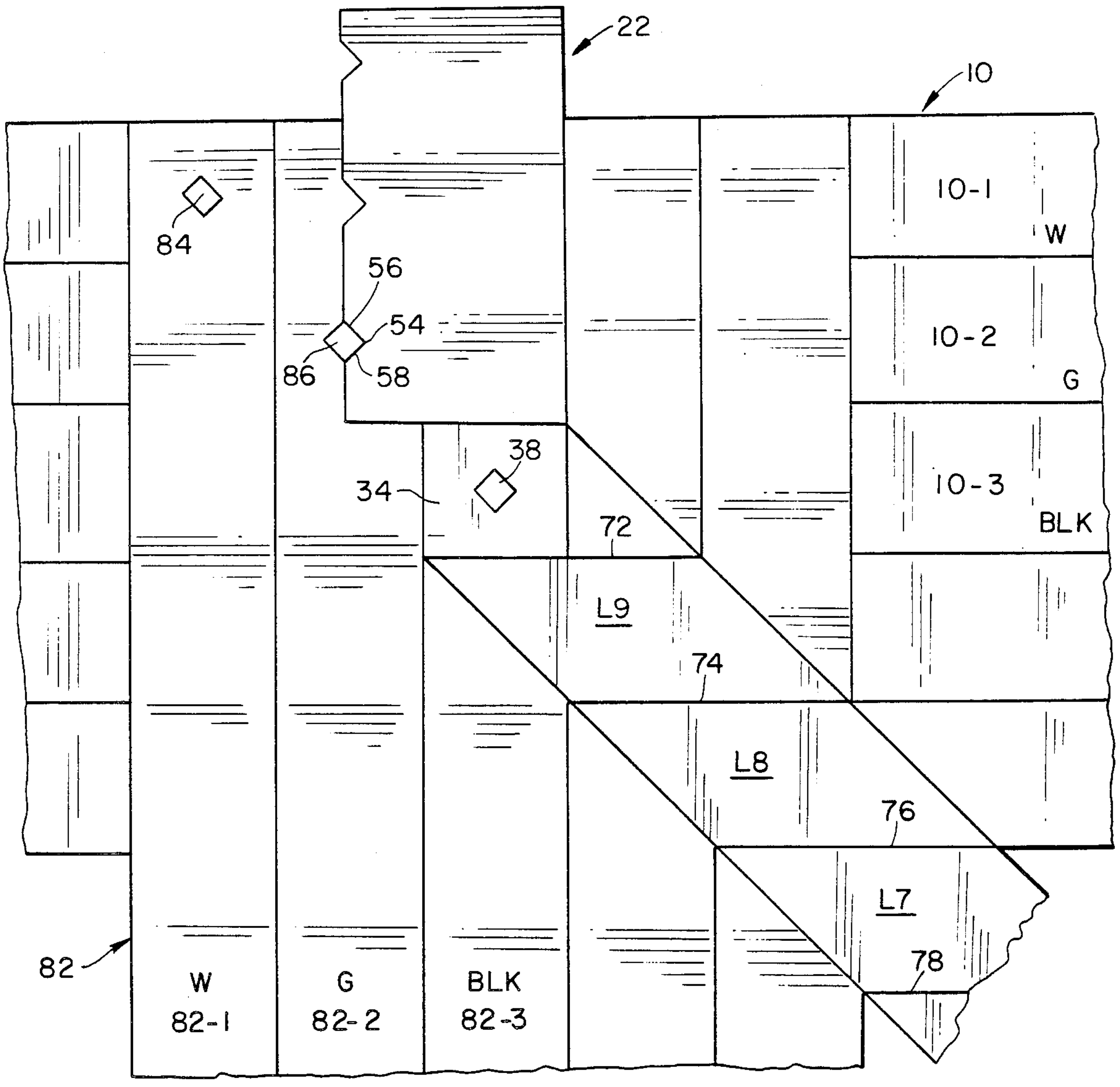
FIG. 5 is a top plan view of the FIG. 1 apparatus indexed into a third position relative to the FIG. 3 cables.
Figure 6:
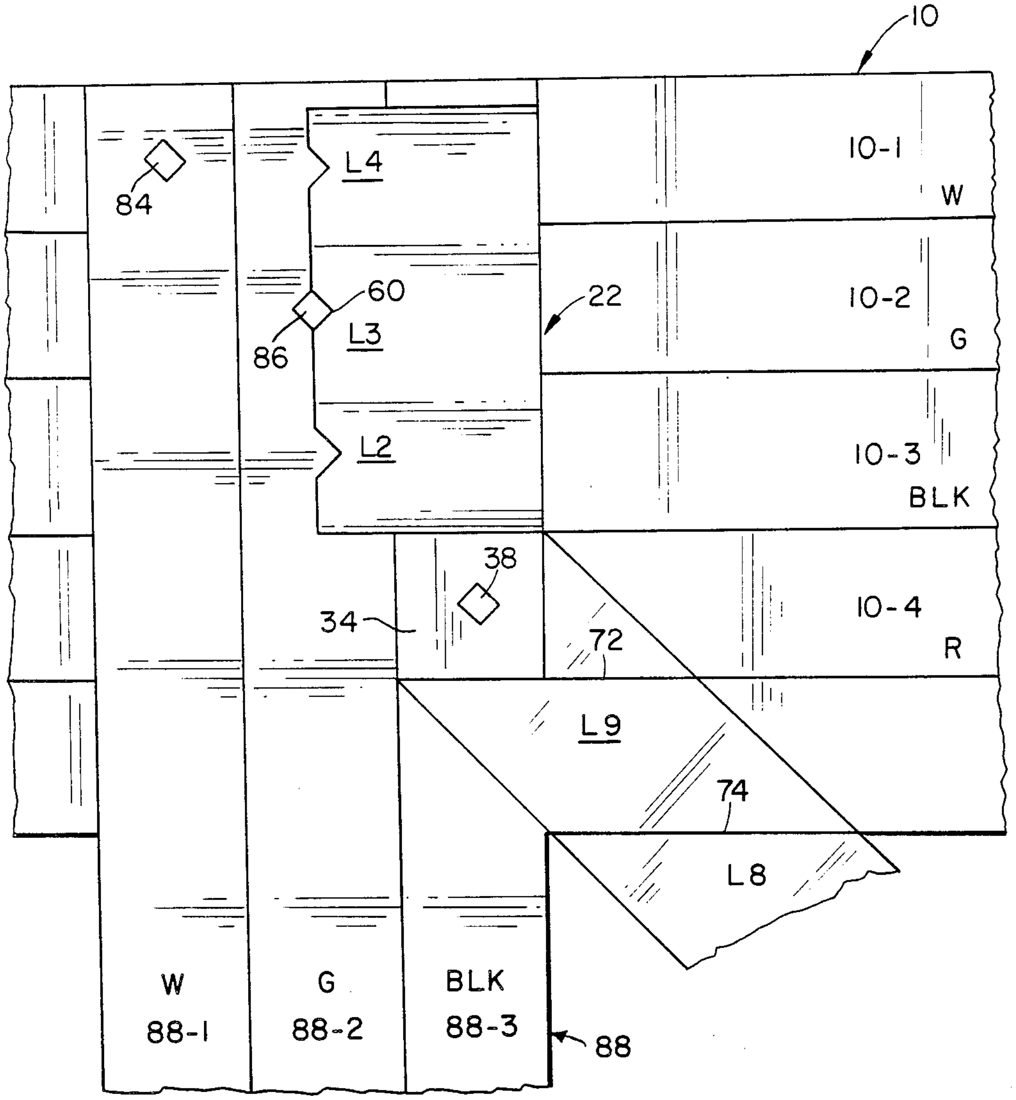
FIG. 6 is a top plan view of the FIG. 1 apparatus applied to an assembly of a five conductor cable and a three conductor cable in tap configuration and and indexed in a "B" phase connection position.

Turning now to FIG. 6, five conductor cable 10 is secured to three conductor cable 88. Origin zone perforation 84 and second perforation 86 are made as in the case of FIGS. 3–5. In undercarpet wiring systems, conductor 10-1 is assigned to neutral and conductor 10-2 is assigned to ground. Conductors 10-3, 10-4 and 10-5 are assigned respectively to the A, B and C phases of a three-phase system. Since cable 88 has only three conductors and since conductors 88-1 and 88-2 are assigned in common with conductors 10-1 and 10-2, cable 88 is a single phase cable and can be assigned to any one of the three phases of cable 10 by the system planner in phase balancing considerations.

Where it is desired to assign cable 88 to A phase, the third perforation is made as in the case of FIG. 5, by aligning notch 54 with the previously made (second) perforation 86, aligning line indicium 76 with the bottom margin of cable 10 and then operating punch 38. Where cable 88 is, however, assigned to B phase, tool 22 is so positioned, as in FIG. 6, such that index notch 60 is aligned with the second made perforation and line indicium 74 is aligned with the bottom of cable 10. This places punch 38 centrally in the connection zone having conductors 10-4 and 88-3 in registry. In the case of assigning cable 88 to C phase, tool 22 is so positioned (FIG. 7) that index notch 66 is aligned with the second made perforation and line indicium 72 is aligned with the bottom margin of cable 10. This places punch 38 centrally in the connection zone having conductors 10-5 and 88-3 in registry. Upon operation of punch 38, the third perforation is now so made that cable 88 is a C phase cable.

Figure 8:
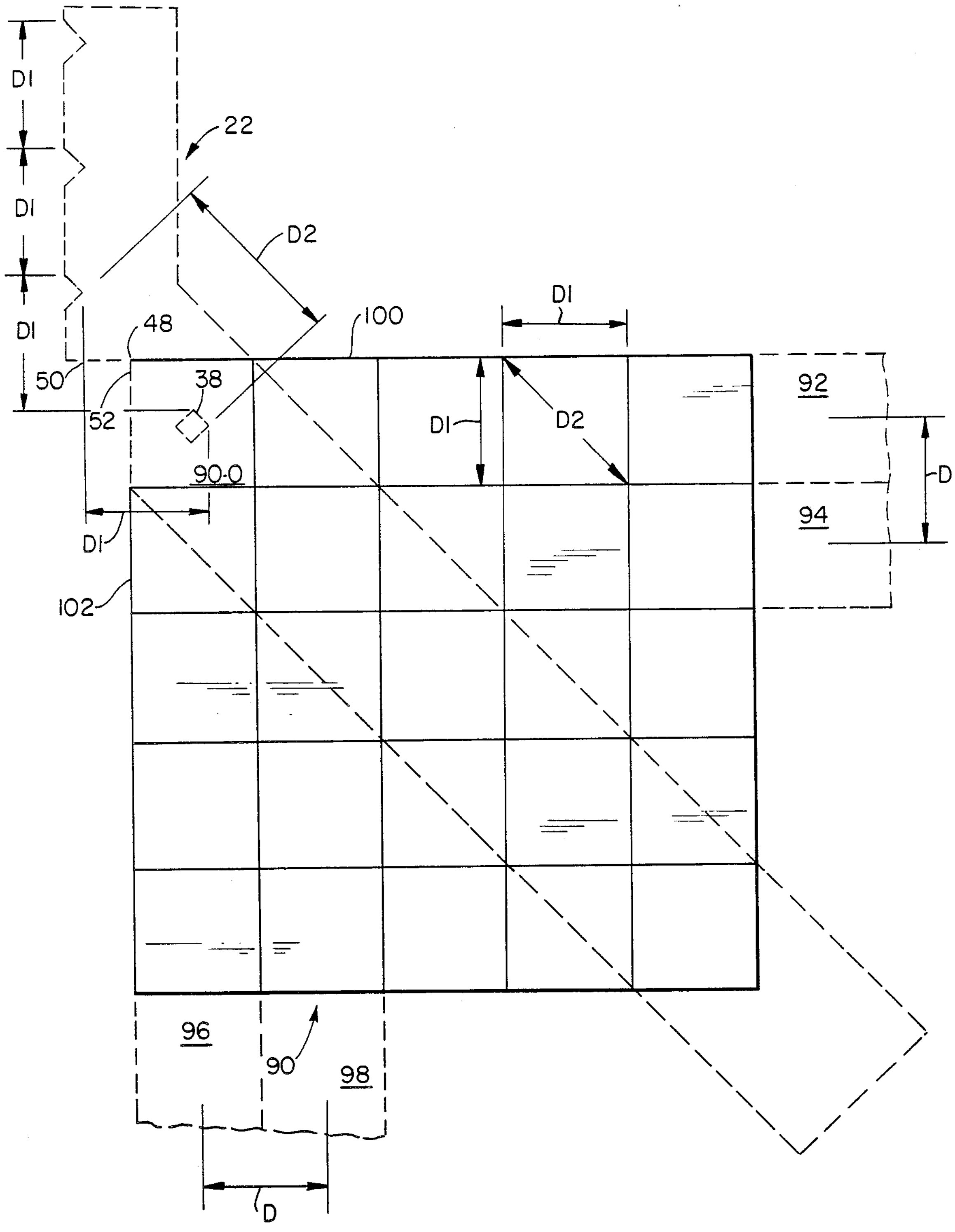
FIG. 8 is an illustration useful in indicating the geometric relations among the various locator indices of the FIG. 1 apparatus.

Referring now to FIG. 8, tool 22 is shown in broken lines against connection zone matrix 90, which is present upon overlapping of two five conductor flat cables having elongate conductors 92, 94 and 96, 98 on centerlines spaced in cable insulation by measure D. Each connection zone is defined by a unique pair of registered conductors in their insulation and is a square of side length D1 (equal to D) and diagonal length D2. With locator notch 48 set such that its edges 50 and 52 are in alignment with the margins 100 and 102 of matrix 90, punch 38 is in registry with matrix origin connection zone 90-0 (cable neutral). Locator notch 54 is spaced by length D2 from punch 38 in the direction of the diagonal of zone 90-0, and is accordingly spaced horizontally leftward and vertically upwardly of punch 38 by lengths D1. Locator notch 60 is spaced from locator notch 54 by length D1 and is vertically thereabove, relative to matrix 90. Locator notch 66 is spaced from locator notch 60 by length D1 and is vertically thereabove, relative to matrix 90. All of notches 54, 60 and 66 are in alignment.

Figure 9:
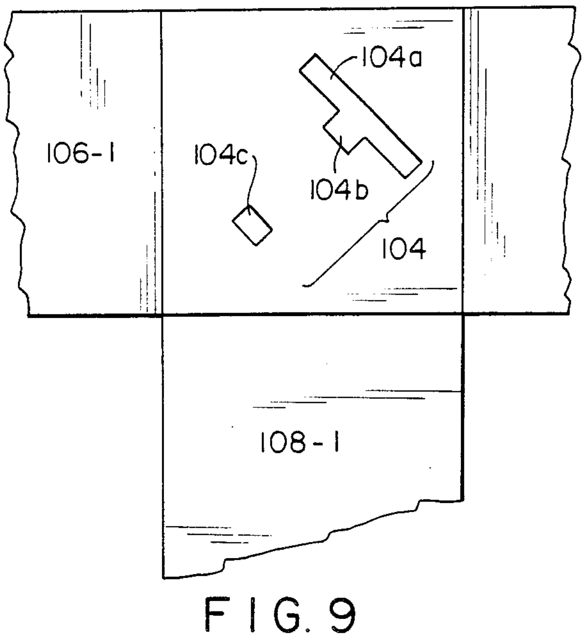
FIG. 9 is a partial perspective view of overlapped multiconductor cables with a preferred punched aperture therethrough.

FIG. 9 depicts a preferred perforation 104 to be made by the punch of tool 22. Perforation 104 is made through conductors 106-1 and 108-1 of cables 106 and 108 and has three definitive parts, slot 104*a*, side extension 104*b* and opening 104*c*.

Figure 10:
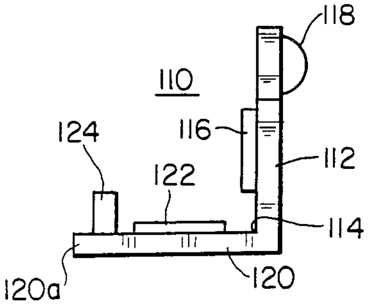
FIG. 10 is a side elevation of a preferred connector for use with the FIG. 9 arrangement.

Connector 110 of FIG. 10 has one arm 112 extending vertically upwardly from fold line 114 and including insulation piercing contacts 116 and a hood 118. A second connector arm 120 extends horizontally leftwardly from fold line 114 and supports insulation-piercing contacts 122 and locking tab 124. In applying connector 110 to perforation 104, it is arranged above the perforation with the free end 120*a* of arm 120 in slot 104*a* and with tab 124 in perforation extent 104*b*. Connector 110 is now pushed into perforation 104 and rotated such that arm 120 resides under the cables and tab 124 resides in perforation opening 104*c*. Arm 112 is now folded onto the cables, tap 124 entering hood 118. Crimping the connector causes electrical continuity to be made between conductors 106-1 and 108-1, respectively.

Figure 11:
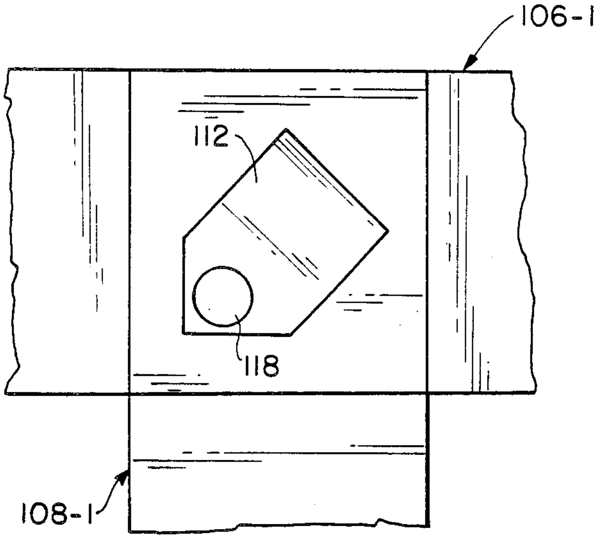
FIG. 11 is a repeat showing of FIG. 9 with the FIG. 10 connector applied thereto.

Further structural detail and operation of connector 110 may be seen in U.S. Pat. No. 4,248,493, commonly-assigned and issued on Feb. 3, 1981 to T. Kuo, to which patent incorporating reference is hereby made. The full assembly of conductor 110 with conductors 106-1 and 108-1 is shown in top plan view in FIG. 11.

Returning again to FIG. 3, each cable typically bears color indication of its conductors, which may be by the imprint of color or a literal statement of color, or both. Conductors 10-1 and 82-1 are white (W). Conductors 10-2 and 82-2 are green (G). Conductors 10-3 and 82-3 are black (BLK). Conductors 10-4 and 82-4 are red (R). Conductors 10-5 and 82-5 are blue (B).

Tool 22 literal indicia legends are as follows. L1 reads "STARTING GUIDE" and is adjacent locator notch 48. L2 reads "0" and is adjacent to locator notch 54. L3 reads "1", and is adjacent locator notch 60. L4 reads "2", is adjacent to locator notch 66. L5 is below line indicium 80 and reads "WHITE-5 COND". L6 is below line indicium 78 and reads "WHITE-4 COND", "GREEN-5 COND. L7 is below line indicium 76 and reads "WHITE-3 COND, "GREEN-4 COND" and "BLACK-5 COND. L8 is below line indicium 74 and reads "GREEN-3 COND", "BLACK-4 COND" and "RED-5 COND. L9 is below line indicium 72 and reads "BLACK-3 COND", "RED-4 COND" and "BLUE-5 COND".

Use of the line and literal indicia as secondary to and supportive of the primary locator notch indices will be understood by reconsideration of FIGS. 3–7.

In FIG. 3, notch 48 is used, the legend L1 so advising for start purposes. Since cable 10 is a five conductor cable and one is making connection to its white (W) conductor, legend L5 is applicable and line 80 is aligned with the bottom margin of cable 10.

Figure 4:
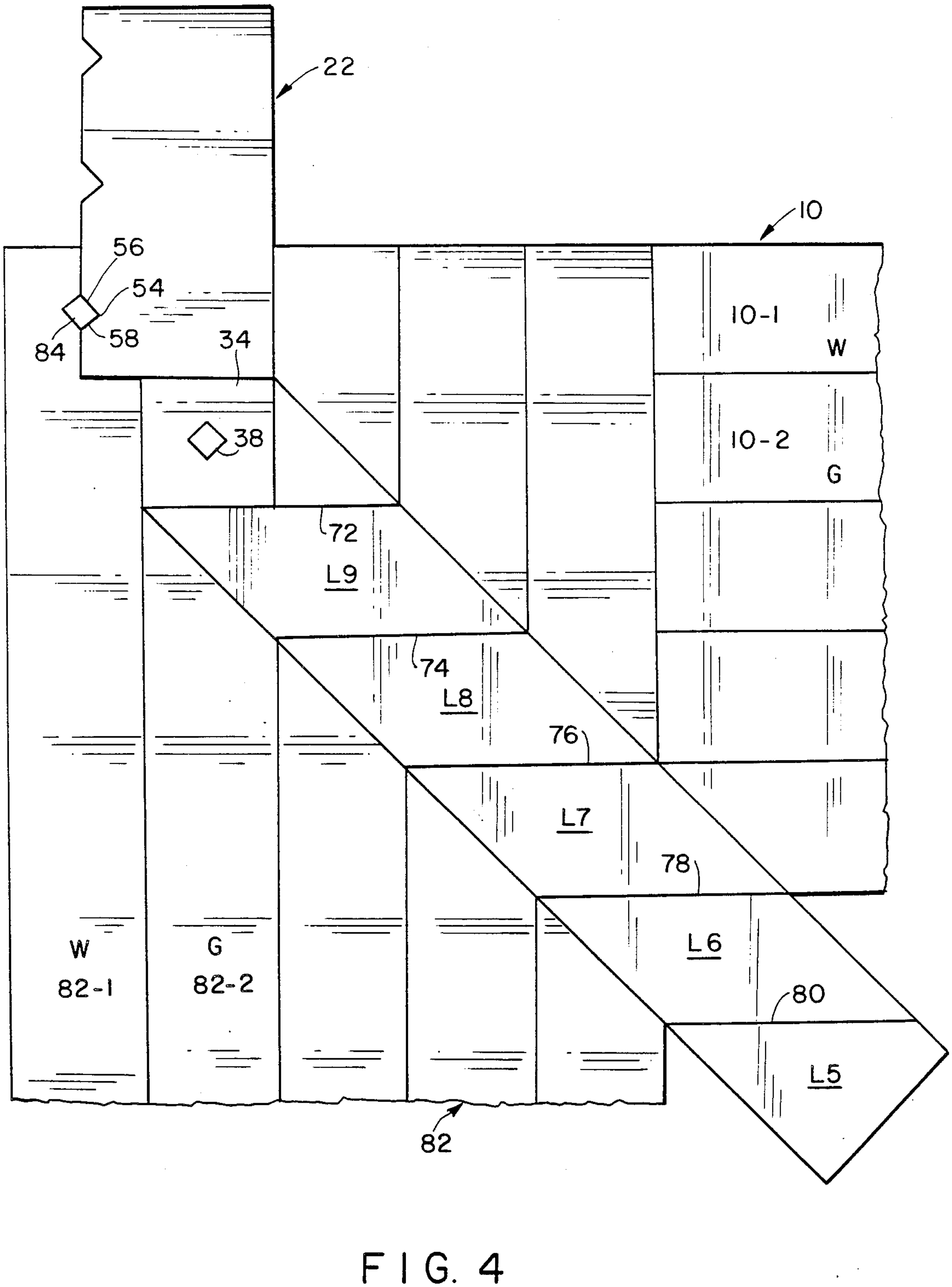
FIG. 4 is a top plan view of the FIG. 1 apparatus indexed into a second position relative to the FIG. 3 cables.

Turning to FIG. 4, notch 54 is used, the legend L2 designated "0" indicates all zones, other than origin and phase balance zones. Since one is making connection to the green (G) conductor, legend L6 is applicable and line 78 is aligned with the bottom margin of cable 10.

In FIG. 5, notch 54 is again used and, since connection is to the black (BLK) conductor, legend L7 applies and line 76 is aligned with the bottom margin of cable 10. Completion of connections to the five-five embodiment would employ notch 54 with legend L8 and line 74 (red conductor) and then with legend L9 and line 72 (blue conductor).

If cable 10 were a four conductor cable, one would not use line indicium 80 since L5 has only five conductor cable content. In this case, the white conductor, four conductor cable connection would be made using line 78, per legend L6. The green, black and red connections are made with line indicia 76, 74 and 72, per legends L7, L8 and L9, respectively.

Similarly, if cable 10 were a three conductor cable, the white, green and black conductor connections would be made with lines 76, 74 and 72 for cable bottom margin alignment, respectively, per legends L7, L8 and L9.

Figure 7:
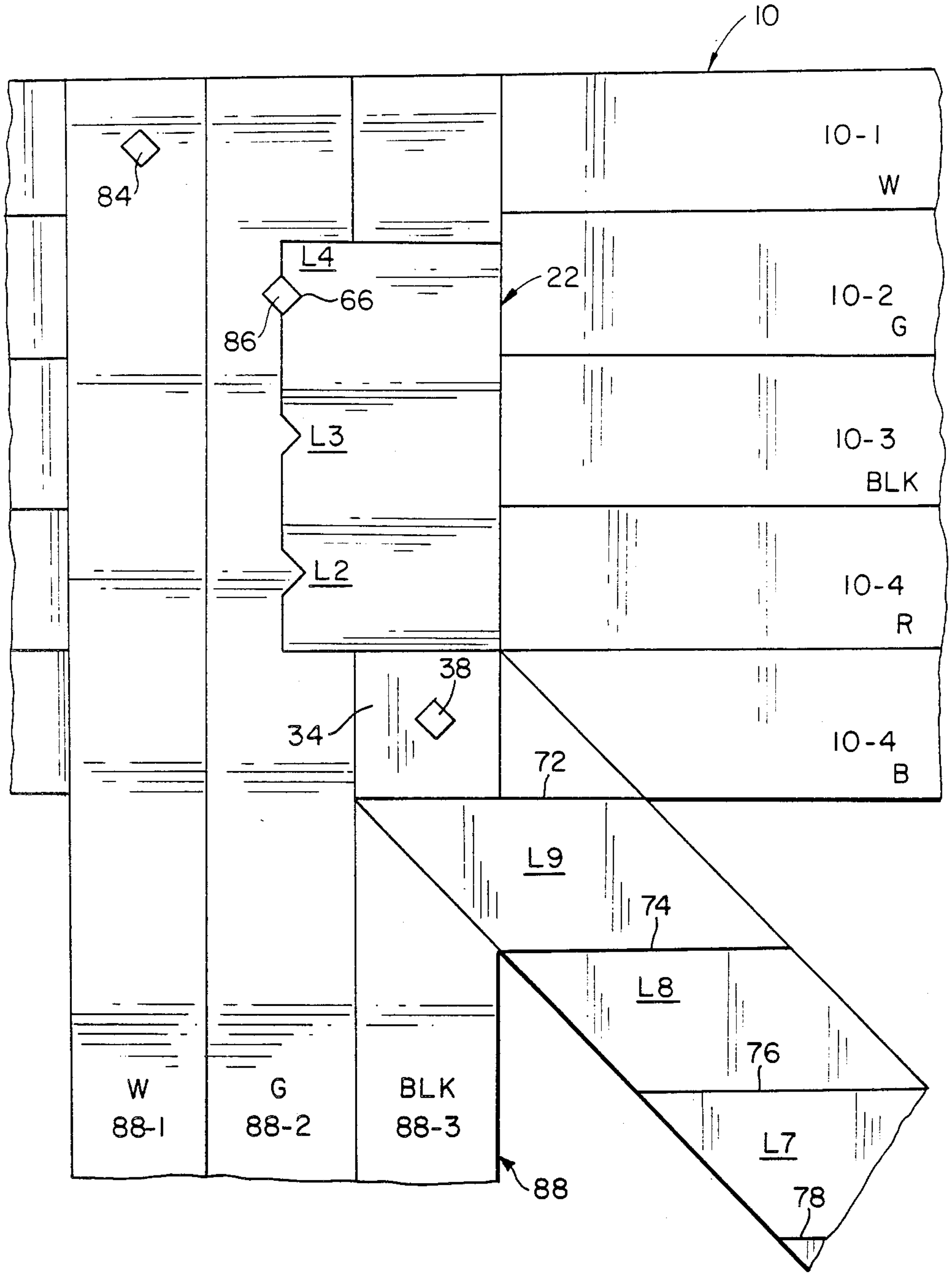
FIG. 7 is a repeat showing of FIG. 6 with the FIG. 1 apparatus indexed in a "C" phase connection position.

FIGS. 6 and 7 involve phase balance, i.e., cases in which a three conductor cable is tapped to a five conductor cable, but not with "A" phase (black conductor). In FIG. 6, the secondary cable is assigned to "B" phase (the red conductor of the feeder cable). Notch 60 (legend L3- "1") is to be used. In FIG. 7, the secondary cable is assigned to C phase (the blue conductor of the feeder cable). Notch 66 (legend L4- "2") is to be used.

As noted above, the apparatus and practice of the invention are also applicable to the making of splices, i.e., connection of conductors of elongate cables which are overlapped in longitudinal sense.

Various changes to the foregoing practices and modifications of the connection zone locating device and kit of components provided by the invention can be made without departing from the invention. Accordingly, it will be appreciated that the particularly illustrated and discussed preferred embodiments are intended in an illustrative and not in a limiting sense. The true spirit and scope of the invention are set forth in the following claims.

What is claimed is:

1. A connection zone location and selection device for application to first and second flat multiconductor cables secured to one another in overlapped relation to thereby define a a matrix of connection zones each having in registry therewith a distinct pair of conductors of said cables, said device comprising: a body member adapted for movement with respect to said cables means; on said body member for making perforations through said cables; and means for registering said body member with a preselected location on said cables or with perforations made by such perforating means for disposing said perforating means in registry with selected ones of said connection zones, said perforation means including a punch fixedly secured to said body member for movement therewith, said punch being operable selectively for making a perforation of predetermined configuration through said cables upon operation thereof and wherein such registration means includes a first index for registry with respective first and second margins of said cables, a second index fixedly spaced from said first index, a third index fixedly spaced from said second index and a fourth index aligned with and fixedly spaced from said second and third index each index having configuration in common with said predetermined configuration for registry with perforations made by said punch.

2. The device claimed in claim 1 further including line indicia on said body for alignment with one of said cables for assisting registry of said second index with said cable.

3. The device claimed in claim 1 further including literal indicia on said body for directing use of said indices.

4. A connection zone location and selection device for application to first and second flat multiconductor cables secured to one another in overlapped relation to thereby define a matrix of connection zones each having in registry therewith a distinct pair of conductors of said cables, each such connection zone being a square of side length D1 and diagonal length D2, said device including a plate member having a perforating aperture therethrough, said plate member further including a first index for registry with respective first and second margins of said cables for placement of said perforating aperture in registry with an origin connection zone and a second index having configuration in common with said perforating aperture and spaced therefrom by length D2.

5. The device claimed in claim 4 further including a third index on said plate member having configuration in common with said perforating aperture and spaced from said second index by length D1.

6. The device claimed in claim 5 further including a fourth index on said plate member having configuration in common with said perforating aperture and spaced from said third index by length D1.

7. The device claimed in claim 6 wherein said second, third and fourth indices are in alignment.

8. The device claimed in claim 4 further including line indicia on said body for alignment with one of said cables for assisting registry of said second index with said cables.

9. The device claimed in claim 4 further including literal indicia on said plate member for directing use of said indices.

10. A kit of parts for making an updercarpet power installation, comprising:

(a) flat multiconductor cable having elongate conductors on centerlines spaced in electrical insulation laterally by measure D;
(b) electrical connectors adapted for insulation-piercing connection of conductors of plural such cables in overlapped arrangment; and
(c) a connection location and selection device for application to first and second such flat multiconductor cables secured to one another in overlapped relation to thereby define a matrix of connection zones each having in registry therewith a distinct pair of conductors of said cables, said device being adapted for movement with respect to said cables and including means thereon for making perforations through said cables and means for registering said device with a preselected location on said cables or with perforations made by such perforating means for disposing said perforating means in registry with selected ones of said connection zones comprising less than all of said connection zones, each such registration zone is a square of said length D1 and diagonal length D2, said device including a plate member 5 having a perforating aperture therethrough, said plate member further including a first index for registry with respective first and second margins of said cables for placement of said perforating aperture in registry with an origin connection zone and a second index having configuration in common with said perforating aperture and space therefrom by length D2.

11. The kit claimed in claim 10 wherein said perforation means comprises a punch fixedly secured with said device for movement therewith, said punch being operable selectively for making a perforation of predetermined configuration through said cables upon operation thereof.

12. The kit claimed in claim 11 wherein such registration means includes a first index for registry with respective first and second margins of said cables and a second index fixedly spaced from said first index and having configuration in common with said predetermined configuration for registry with perforations made by said punch.

13. The kit claimed in claim 12 wherein said registration means includes a third index fixedly spaced from said second index and having like configuration thereto for registry with perforations made by said punch.

14. The kit claimed in claim 13 wherein said registration means includes a fourth index aligned with and fixedly spaced from both said second and third indices and having like configuration thereto for registry with perforations made by said punch.

15. The kit claimed in claim 10 further including line indicia for alignment with one of said cables for assisting registry of said second index with said cables.

16. The kit claimed in claim 10 further including literal indicia for directing use of said indices.

17. The kit claimed in claim 1 further including a third index on said plate member having configuration in common with said perforating aperture and spaced from said second index by length D1.

18. The kit claimed in claim 17 further including a fourth index on said plate member having configuration in common with said perforating aperture and spaced from said third index by length D1.

19. The kit claimed in claim 18 wherein said second, third and fourth indices are in alignment.

20. In a method for making a power installation with flat cables having plural conductors in electrical insulation, the steps of:

(a) assembling a first such cable in overlapping relation to a second such cable;
(b) supporting a punch and plural locator indices in mutually fixed relation;
(c) registering a first such locator index with a preselected location on such cable assembly;
(d) operating said punch to make a first perforation through said cable assembly;
(e) registering a second such locator index with said first perforation; and
(f) operating said punch to make a second perforation through said cable assembly.

21. The invention claimed in claim 20 including the further steps of registering said second locator index with said second perforation and operating said punch to make a third perforation through said cable assembly.

22. The invention claimed in claim 21 including the further step of inserting an insulation-piercing connector into each of said first, second and third perforations and crimping same onto said cable assembly to electrically interconnect conductors of said cables.

23. In a method for making a power installation with flat cables having plural conductors in electrical insulation, the steps of:

(a) assembling a first such cable in overlapping relation to a second such cable;

(b) supporting a punch and first, second and third locator indices in mutually fixed relation;

(c) registering said first locator index with a preselected location on such cable assembly;

(d) operating said punch to make a first perforation through said cable assembly;

(e) registering said second locator index with said first perforation;

(f) operating said punch to make a second perforation through said cable assembly;

(g) registering said third locator index with said second perforation; and (h) operating said punch to make a third perforation through said cable assembly.

24. In a method for making a power installation with flat cables having plural conductors in electrical insulation, the steps of:

(a) assembling a first such cable in overlapping relation to a second such cable;

(b) supporting a punch and first, second, third and fourth locator indices in mutually fixed relation;

(c) registering said first locator index with a preselected location on such cable assembly;

(d) operating said punch to make a first perforation through said cable assembly;

(e) registering said second locator index with said first perforation;

(f) operating said punch to make a second perforation through said cable assembly;

(g) registering a selective one of said third and fourth locator indiced with said second perforation; and (h) operating said punch to make a third perforation through said cable assembly.

* * * * *